(12) United States Patent
Ho et al.

(10) Patent No.: US 7,596,460 B2
(45) Date of Patent: Sep. 29, 2009

(54) SYSTEM AND METHOD FOR CALCULATING A VOLTAGE SPIKE VALUE

(75) Inventors: Duen-Yi Ho, Taipei Hsien (TW); Shou-Kuo Hsu, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 115 days.

(21) Appl. No.: 11/627,378

(22) Filed: Jan. 26, 2007

(65) Prior Publication Data
US 2007/0233408 A1    Oct. 4, 2007

(30) Foreign Application Priority Data
Mar. 31, 2006    (CN) ............ 200610060129

(51) Int. Cl.
*G01R 13/00*    (2006.01)
(52) U.S. Cl. .................. 702/65; 702/69; 327/58; 324/76.12
(58) Field of Classification Search ............ 702/57–60, 702/64–66, 69; 327/50, 58, 60, 62, 72, 73; 324/76.12, 76.13, 76.15, 76.18, 103 R, 103 P; 361/18
See application file for complete search history.

(56) References Cited

U.S. PATENT DOCUMENTS

| 4,746,816 A | * | 5/1988 | Olesen | 327/20 |
| 5,280,256 A | * | 1/1994 | Tan | 333/167 |
| 6,937,115 B2 | | 8/2005 | Perreault et al. | |

* cited by examiner

*Primary Examiner*—Manuel L Barbee
(74) *Attorney, Agent, or Firm*—Wei Te Chung

(57) ABSTRACT

A method for calculating a voltage spike value includes: predefining calculating requirements; inputting parameter values; analyzing whether inputted parameter values match with the calculating requirements; establishing a computing formula for calculating the voltage spike value if the inputted parameter values match with the calculating requirements; and calculating the voltage spike value by utilizing the inputted parameter values and the computing formula. A related system is also disclosed.

12 Claims, 5 Drawing Sheets

SYSTEM AND METHOD FOR CALCULATING A VOLTAGE SPIKE VALUE

BACKGROUND OF THE INVENTION

1. Field of the Invention

The present invention generally relates to systems and methods for analyzing voltage spikes, and more particularly to a system and method for calculating a voltage spike value.

2. Description of Related Art

Voltage regulation modules (VRM) are commonly employed in various electronic products, especially in portable devices, to provide a stable supply voltage. It is well known that a VRM transient occurs when a current of the VRM is momentarily switched from a first value to a second value. The VRM transient is an unstabilizing factor to the electronic products, especially the portable devices. If the VRM transient occurs, the VRM may not provide a stable supply voltage for a central processing unit (CPU) of an electronic product, further, filter capacitors electrically connected with the VRM may bring voltage spikes correspondingly. If the VRM is to be employed to the electronic product, attention needs to be paid to the VRM transient and the voltage spikes brought by the filter capacitors.

Unfortunately, there is no effective equipment/method to exactly calculate a value of the voltage spikes brought by the filter capacitors, and further to analyze whether the VRM is adaptive to the electronic product according to calculated voltage spike value.

What is needed, therefore, is a system and method that can be utilized to exactly calculate a value of the voltage spikes brought by the filter capacitors, so as to accurately analyze whether the VRM is adaptive to the electronic product according to calculated voltage spike value.

SUMMARY OF THE INVENTION

A system for calculating a voltage spike value in accordance with a preferred embodiment includes a storage unit, a data obtaining unit, an analyzing unit, and a data processing unit. The storage unit is configured for receiving calculating requirements. The data obtaining unit is configured for inputting parameter values. The analyzing unit is configured for analyzing whether inputted parameter values match with the calculating requirements. The data processing unit is configured for establishing a computing formula for calculating the voltage spike value if the inputted parameter values match with the calculating requirements, and for calculating the voltage spike value by utilizing the inputted parameter values and the computing formula.

A method for calculating a voltage spike value in accordance with a preferred embodiment includes the steps of: predefining calculating requirements; inputting parameter values; analyzing whether inputted parameter values match with the calculating requirements; establishing a computing formula for calculating the voltage spike value if the inputted parameter values match with the calculating requirements; and calculating the voltage spike value by utilizing the inputted parameter values and the computing formula.

Other advantages and novel features of the present invention will become more apparent from the following detailed description of preferred embodiments when taken in conjunction with the accompanying drawings.

DETAILED DESCRIPTION OF THE INVENTION

Figure 1:
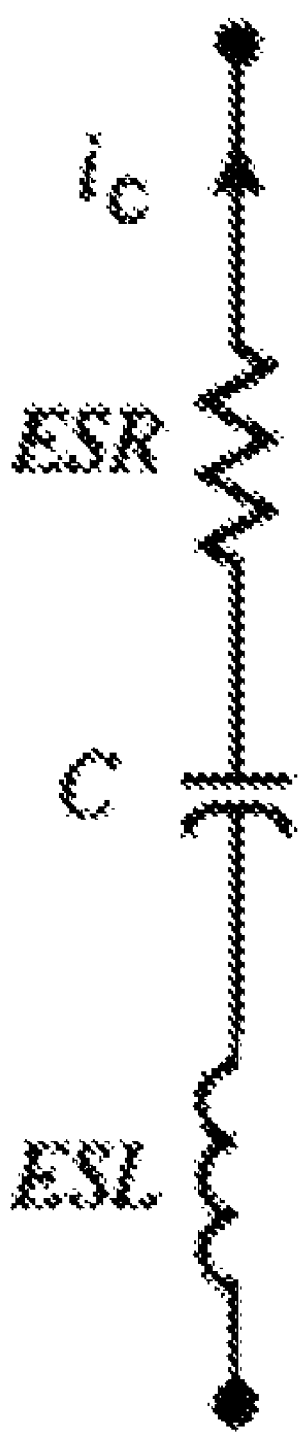
FIG. 1 is a schematic diagram of parasitic elements of a filter capacitor.

FIG. 1 is a schematic diagram of elements of a filter capacitor. The elements of the filter capacitor includes a capacitance "C", an equivalent series resistance (ESR), and an equivalent series inductance (ESL). "$i_C$" denotes the current flowing through the filter capacitor.

Figure 2:
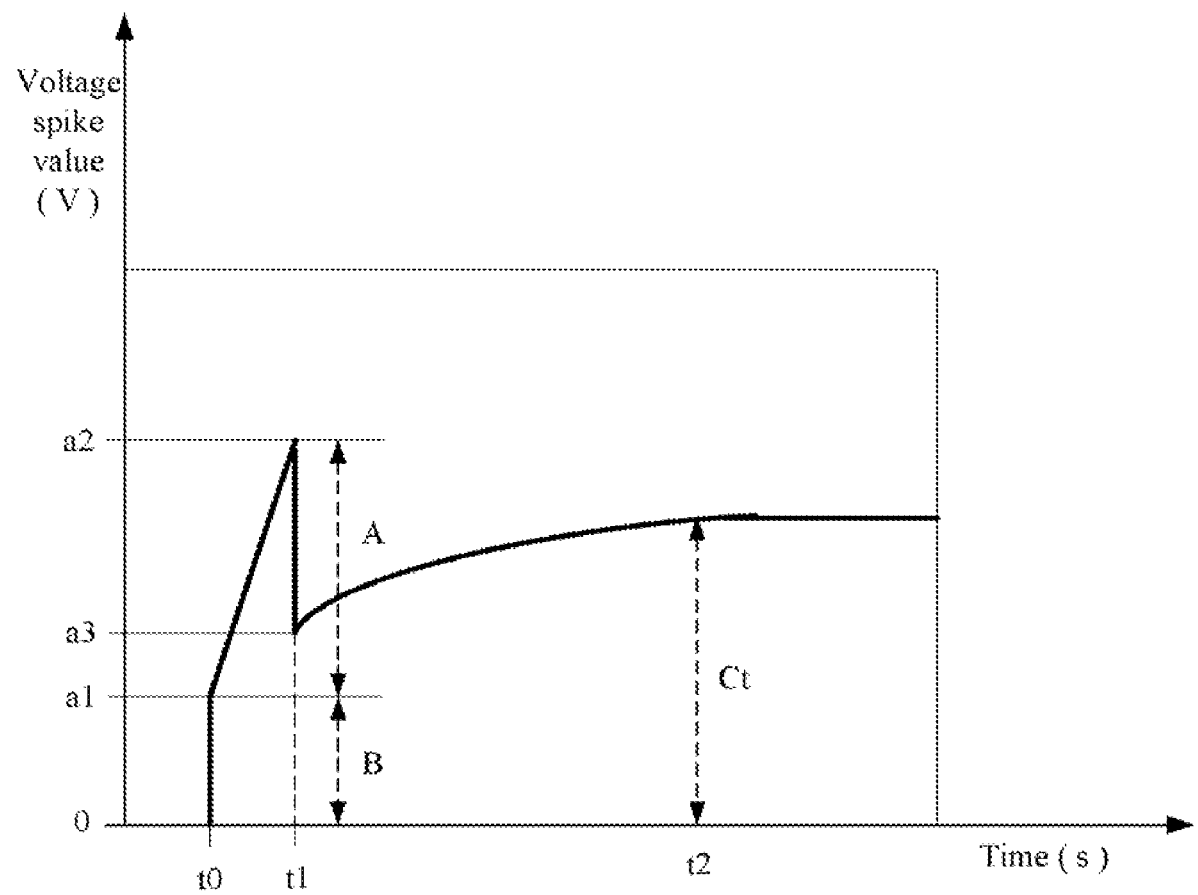
FIG. 2 is a schematic graph of a voltage spike brought by the filter capacitor of FIG. 1.

FIG. 2 is a schematic graph of a voltage spike brought by the filter capacitor of FIG. 1 with respect to time "t". The filter capacitor brings the voltage spike when a current of a voltage regulation module (VRM) that is electrically connected with the filter capacitor is momentarily switched from a high value to a low value. The graph of FIG. 2 represents an example of voltage spike levels (indicated along voltage spike axis) of the parasitic elements with respect to time. The filter capacitor begins to bring the voltage spike with a first value "a1" at an initial time "t0". During a power up time from the initial time t0 to a first time "t1", the voltage spike increases proportionally and reaches its peak to a second value "a2" at the first time "t1". After the power up time, the voltage spike suddenly reduces to a first level and steadily approaches and reaches a second level at a second time "t2" at which the VRM supplies a stable electric power. The value of the voltage spike at the first level is a third value "a3" and is in a range between the first value a1 and the second value a2.

The capacitance "C" brings the part "Ct" of the voltage spike, the ESR brings the part "A" of the voltage spike, and the ESL brings the part "B" of the voltage spike. "$\Delta V_{ESR}$" denotes the value of the part A, and "$\Delta V_{ESL}$" denotes the value of the part B. At the second time t1, the voltage spike is almost brought by the ESR and the ESL, the voltage spike mainly includes the part A and the part B, the value of the voltage spike equals the sum of the value $\Delta V_{ESR}$ and the value $\Delta V_{ESL}$. At the third time t2, the voltage spike is almost brought by the capacitance C, the voltage spike mainly includes the part Ct.

Figure 3:
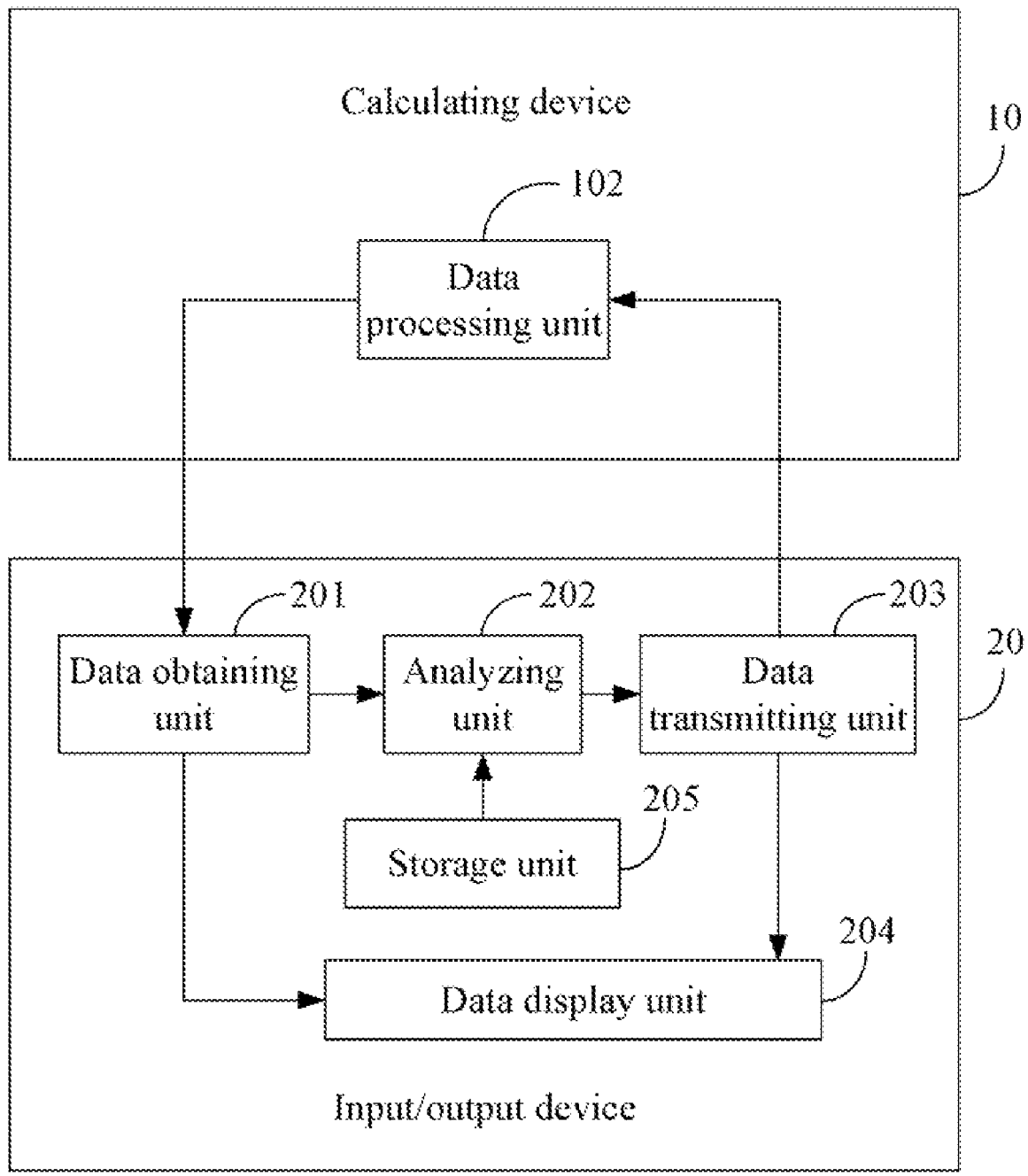
FIG. 3 is a schematic diagram of a hardware configuration of a system for calculating a voltage spike value in accordance with a preferred embodiment.

FIG. 3 is a schematic diagram of a hardware configuration of a system for calculating a voltage spike value (hereinafter, "the system") in accordance with a preferred embodiment. The system is configured (i.e., structured and arranged) for calculating the voltage spike value of voltage spikes brought by one or more filter capacitors that are electrically connected with a VRM. The system may include a calculating device 10, and an input/output device 20 connected with the calculating device 10. The input/output device 20 is for storing calculating requirements and a predefined password that are preconfigured by a user, for prompting a user interface for the user to input a password and parameter values, for analyzing whether inputted password matches with the predefined password, and for analyzing whether inputted parameter values match with the calculating requirements. The calculating device 10 is for calculating the voltage spike value of the voltage spikes brought by the filter capacitors according to the inputted parameter values.

Since the filter capacitors typically includes one or more bulk capacitors and one or more coupling capacitors, the inputted parameter values typically include a stable electric power value supplied by the VRM, a highest current (hereinafter, "$i_{max}$") and a lowest current (hereinafter, "$i_{min}$") of the VRM when a current of the VRM is momentarily switched from the highest current $i_{max}$ to the lowest current $i_{min}$, capacitance values of the bulk capacitors and the coupling capacitors, ESR values and ESL values of the bulk capacitors, ESR values and ESL values of the coupling capacitors, an amount of the bulk capacitors and an amount of the coupling capacitors, and a slew rate of the current of the VRM.

The input/output device 20 typically includes a data obtaining unit 201, a data transmitting unit 203, a storage unit 205, a data display unit 204 connected with the data obtaining unit 201 and the data transmitting unit 203, and an analyzing unit 202 connected with the data obtaining unit 201, the data transmitting unit 203, and the storage unit 205. The calculating device 10 typically includes a data processing unit 102 that is connected with the data obtaining unit 201 and the data transmitting unit 203 of the input/output device 20.

The data display unit 204 is configured for displaying data typically including a first message denoting that the inputted password is invalid, a second message denoting that the inputted parameter values are unacceptable, and the voltage spike value calculated by the data processing unit 102.

The storage unit 205 is configured for receiving the predefined password and the calculating requirements. The calculating requirements typically include required parameter values for calculating the voltage spike value, and an acceptable range of each parameter value.

The data obtaining unit 201 is configured for prompting the user interface for the user to input the password and the parameter values, for obtaining calculated voltage spike value from the data processing unit 102, and for transmitting obtained voltage spike value to the data display unit 204.

The analyzing unit 202 is configured for analyzing whether the inputted password matches with the predefined password by comparing the inputted password with the predefined password, and for analyzing whether the inputted parameter values match with the calculating requirements.

The data transmitting unit 203 is configured for transmitting the first message to the data display unit 204 if the inputted password does not match with the predefined password, for transmitting the second message to the data display unit 204 if the inputted parameter values do not match with the calculating requirements, and for transmitting the inputted parameter values to the data processing unit 102 if the inputted parameter values match with the predefined calculating requirements.

The data processing unit 102 is configured for simulating a voltage spike analyzing circuit according to configuration information of the filter capacitors, for establishing a computing formula for calculating the voltage spike value according to the voltage spike analyzing circuit, and for calculating the voltage spike value by utilizing the inputted parameter values and the computing formula. In the preferred embodiment, the data processing unit 102 establishes the computing formula according to the voltage spike analyzing circuit by utilizing Laplace transform technique.

Figure 4:
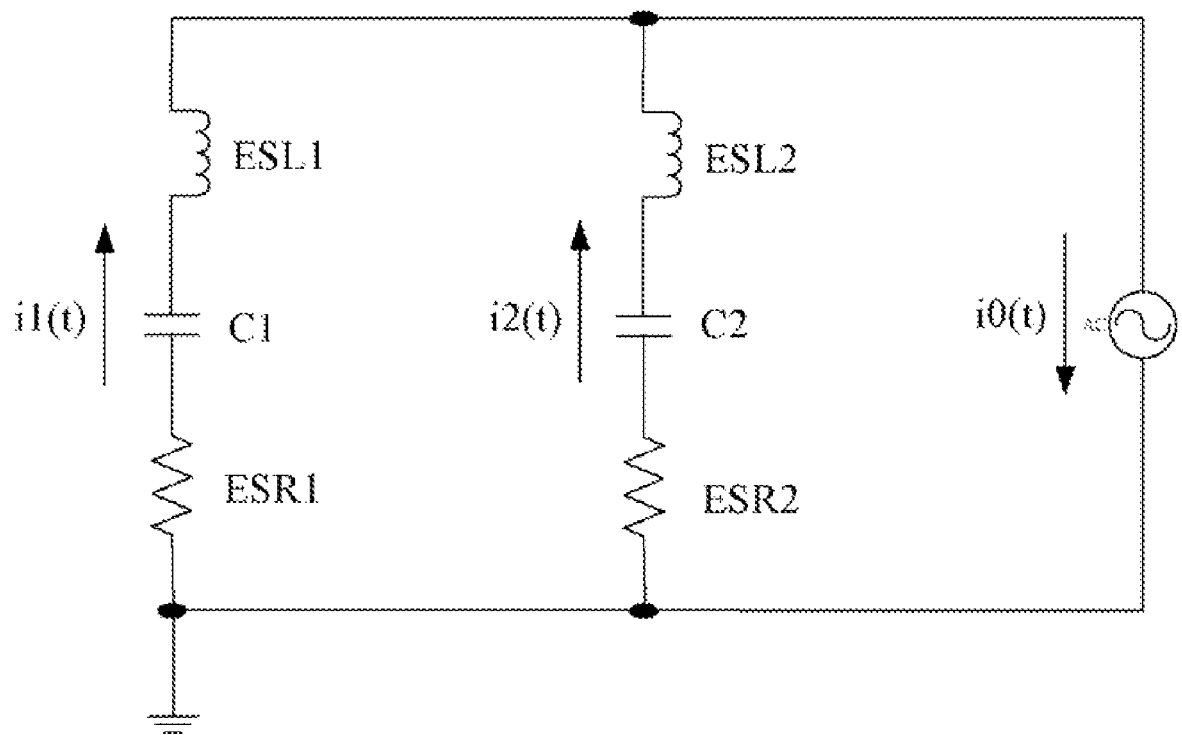
FIG. 4 is a schematic diagram of a voltage spike analyzing circuit simulated by a data processing unit of the system of FIG. 3.

FIG. 4 is a schematic diagram of the voltage spike analyzing circuit simulated by the data processing unit 102. All bulk capacitors are simulated with a first equivalent capacitor, and all coupling capacitors are simulated with a second equivalent capacitor. "ESL1" denotes a value of an ESL of the first equivalent capacitor, "ESR1" denotes a value of an ESR of the first equivalent capacitor, "C1" denotes a capacitance value of a capacitance C of the first equivalent capacitor, and "$i_1(t)$" denotes a current flowing through the first equivalent capacitor. "ESL2" denotes a value of an ESL of the second equivalent capacitor, "ESR2" denotes a value of an ESR of the second equivalent capacitor, "C2" denotes a capacitance value of a capacitance C of the second equivalent capacitor, and "$i_2(t)$" denotes a current flowing through the second equivalent capacitor. "$i_0(t)$" denotes a result current of the voltage spike analyzing circuit. The current $i_0(t)$, the current $i_1(t)$ and the current $i_2(t)$ are all dependent variables determined by the independent time variable "t", and the current $i_0(t)$ equals the sum of the current $i_1(t)$ and the current $i_2(t)$.

Figure 5:
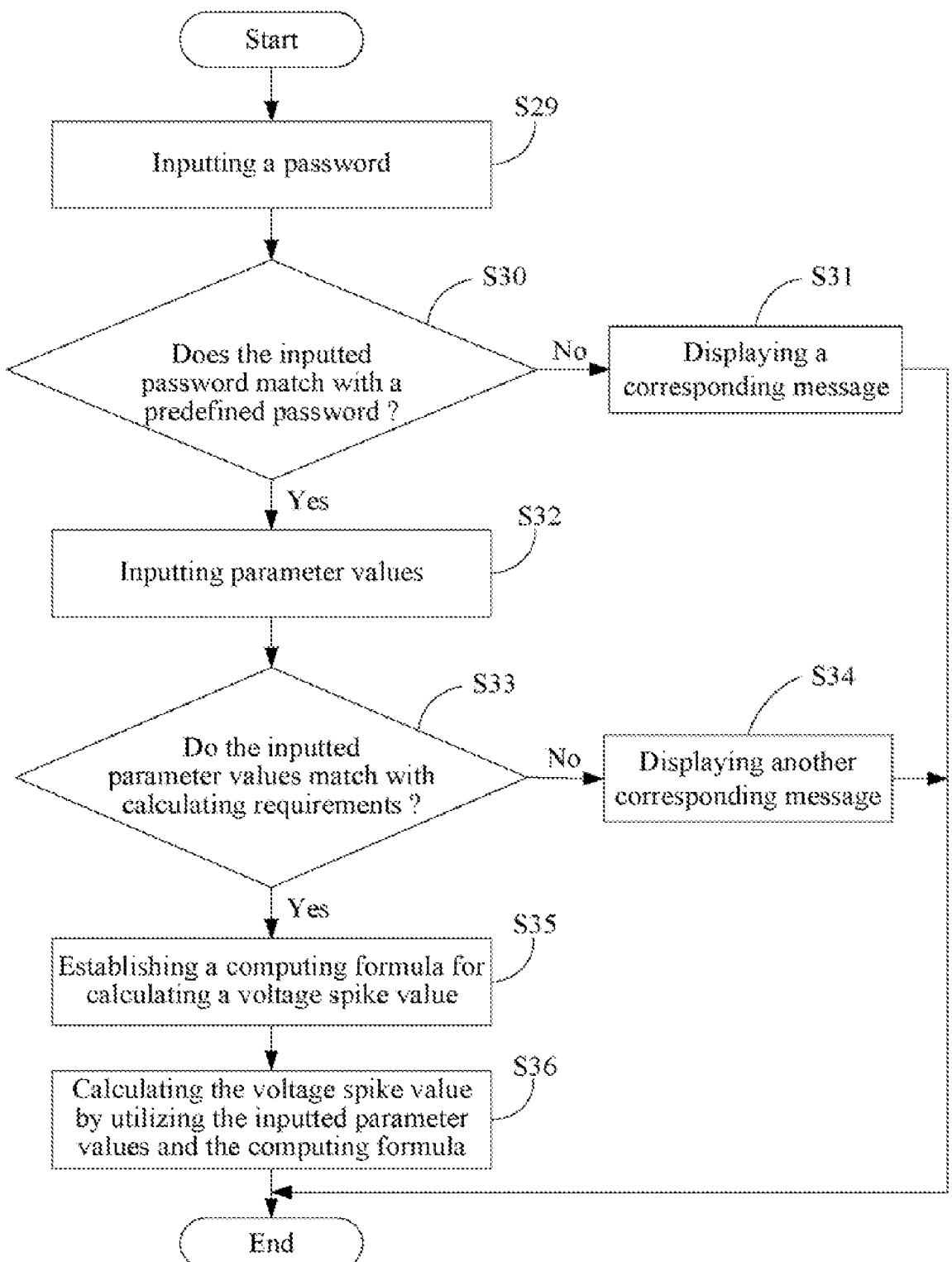
FIG. 5 is a flowchart of a method for calculating a voltage spike value in accordance with a preferred embodiment.

FIG. 5 is a flowchart of a method for calculating a voltage spike value in accordance with a preferred embodiment. The system of FIG. 3 may be used to calculate the voltage spike value of the voltage spikes brought by the filter capacitors, when the current of the VRM is momentarily switched from the highest current $i_{max}$ to the lowest current $i_{min}$.

In step S29, the data obtaining unit 201 prompts the user interface for the user to input the password. In step S30, the analyzing unit 202 analyzes whether the inputted password matches with the predefined password stored in the storage unit 205, by comparing the inputted password with the predefined password. If the inputted password does not match with the predefined password, in step S31, the data transmitting unit 203 transmits the first message to the data display unit 204.

Otherwise, if the inputted password matches with the predefined password, in step S32, the data obtaining unit 201 prompts the user interface for the user to input the parameter values. In step S33, the analyzing unit 202 analyzes whether the inputted parameter values match with the calculating requirements stored in the storage unit 205. If the inputted parameter values do not match with the predefined calculating requirements, in step S34, the data transmitting unit 203 transmits the second message to the data display unit 204.

Otherwise, if the inputted parameter values match with the calculating requirements, in step S35, the data transmitting unit 203 transmits the inputted parameter values to the data processing unit 102. The data processing unit 102 simulates the voltage spike analyzing circuit according to configuration information of the filter capacitors, and establishes the computing formula for calculating the voltage spike value according to the voltage spike analyzing circuit by utilizing Laplace transform technique.

In the preferred embodiment, the data processing unit 102 gets a current formula of the current $i_2(t)$ by inversing Laplace transform, and establishes the computing formula shown as follow: $\Delta V = \Delta V_1 + \Delta V_2$. "$\Delta V_1$" denotes a value of the voltage spike brought by the first equivalent capacitor, "$\Delta V_2$" denotes a value of the voltage spike brought by the second equivalent capacitor, "$\Delta V$" denotes the voltage spike value to be calculated. The current formula of the current $i_2(t)$ is shown as follow:

$$i_2(t) = \frac{\left(ESL1 \cdot t^2 + ESR1 \cdot t + \frac{1}{C1}\right) \cdot \frac{SR}{t^2}}{(ESL1 + ESL2) \cdot t^2 + (ESR1 + ESR2) \cdot t\left(\frac{1}{C1} + \frac{1}{C2}\right)},$$

the formula of the $\Delta V_1$ is shown as follow:

$$\Delta V_1 = i_1(t) \cdot ESR1 + ESL1 \cdot \frac{i_1(t)}{t} + \frac{1}{C1} \cdot SR \cdot \frac{t^2}{2},$$

the formula of the $\Delta V_2$ is shown as follow:

$$\Delta V_2 = i_2(t) \cdot ESR2 + ESL2 \cdot \frac{i_2(t)}{t} + \frac{1}{C2} \cdot SR \cdot \frac{t^2}{2},$$

the current formula of the current $i_1(t)$ is shown as follow: $i_1(t)=i_0(t)-i_2(t)$, and the formula of the time variable t is shown as follow:

$$t = \Delta i_0 / SR.$$

"SR" denotes the slew rate of the current of the VRM been switched, "$\Delta i_0$" denotes an absolute value of the current of the VRM been switched. The formula of the absolute value $\Delta i_0$ is shown as follow: $\Delta i_0 = i_{max} - i_{min}$.

In step S36, the data processing unit 102 calculates the voltage spike value $\Delta V$ by utilizing the inputted parameter values and the computing formula. The data obtaining unit 201 obtains calculated voltage spike value from the data processing unit 102, and transmits obtained voltage spike value to the data display unit 204.

It should be emphasized that the above-described embodiments of the preferred embodiments, particularly, any "preferred" embodiments, are merely possible examples of implementations, merely set forth for a clear understanding of the principles of the invention. Many variations and modifications may be made to the above-described preferred embodiment(s) without departing substantially from the spirit and principles of the invention. All such modifications and variations are intended to be included herein within the scope of this disclosure and the above-described preferred embodiment(s) and protected by the following claims.

What is claimed is:

1. A system for calculating a voltage spike value, the system comprising:
    a storage unit configured for receiving calculating requirements;
    a data obtaining unit configured for inputting parameter values;
    an analyzing unit configured for analyzing whether inputted parameter values match with the calculating requirements;
    a data processing unit configured for simulating a voltage spike analyzing circuit according to configuration information of filter capacitors that are electrically connected with a voltage regulation module if the inputted parameter values match with the calculating requirements, for establishing the computing formula according to the voltage spike analyzing circuit by utilizing an inversion of Laplace transform, and for calculating the voltage spike value by utilizing the inputted parameter values and the computing formula; and
    a data display unit configured for displaying a denoting message if the inputted parameter values do not match with the calculating requirements.

2. The system as claimed in claim 1, wherein the calculating requirements comprise required parameter values for calculating the voltage spike value, and an acceptable range of each parameter value.

3. The system as claimed in claim 1, wherein the data display unit is further configured for displaying the voltage spike value calculated by the data processing unit.

4. The system as claimed in claim 1, wherein the filter capacitors comprise one or more bulk capacitors and one or more coupling capacitors.

5. The system as claimed in claim 4, wherein the bulk capacitors are simulated with a first equivalent capacitor in the voltage spike analyzing circuit, and the coupling capacitors are simulated with a second equivalent capacitor in the voltage spike analyzing circuit.

6. The system as claimed in claim 5, wherein the computing formula is shown as follow: $\Delta V = \Delta V_1 + \Delta V_2$, "$\Delta V_1$" denotes a value of the voltage spike brought by the first equivalent capacitor, "$\Delta V_2$" denotes a value of the voltage spike brought by the second equivalent capacitor, and "$\Delta V$" denotes the voltage spike value to be calculated.

7. A method for calculating a voltage spike value, the method comprising the steps of:
    predefining calculating requirements;
    inputting parameter values via an input/output device;
    analyzing whether inputted parameter values match with the calculating requirements;
    displaying denoting messages and ending the method via the input/output device if the inputted parameter values do not match with the predefined calculating requirements, or simulating a voltage spike analyzing circuit via a calculating device according to configuration information of filter capacitors that are electrically connected with a voltage regulation module if the inputted parameter values match with the calculating requirements;
    establishing a computing formula via the calculating device according to the voltage spike analyzing circuit by utilizing an inversion of Laplace transform; and
    calculating the voltage spike value via the calculating device by utilizing the inputted parameter values and the computing formula.

8. The method as claimed in claim 7, wherein the calculating requirements comprise required parameter values for calculating the voltage spike value, and an acceptable range of each parameter value.

9. The method as claimed in claim 7, further comprising the step of:
    displaying the calculated voltage spike value.

10. The method as claimed in claim 7, wherein the filter capacitors comprise one or more bulk capacitors and one or more coupling capacitors.

11. The method as claimed in claim 10, wherein the bulk capacitors are simulated with a first equivalent capacitor in the voltage spike analyzing circuit, and the coupling capacitors are simulated with a second equivalent capacitor in the voltage spike analyzing circuit.

12. The method as claimed in claim 11, wherein the computing formula is shown as follow: $\Delta V = \Delta V_1 + \Delta V_2$, "$\Delta V_1$" denotes a value of the voltage spike brought by the first equivalent capacitor, "$\Delta V_2$" denotes a value of the voltage spike brought by the second equivalent capacitor, and "$\Delta V$" denotes the voltage spike value to be calculated.

* * * * *